United States Patent [19]
Cahuzac

[11] Patent Number: 5,914,002
[45] Date of Patent: Jun. 22, 1999

[54] METHOD AND SYSTEM FOR PRODUCING A REINFORCEMENT FOR A COMPOSITE COMPONENT

[75] Inventor: Georges Cahuzac, Le Bouscat, France

[73] Assignee: Aerospatiale Societe Nationale Industrielle, Paris, France

[21] Appl. No.: 08/677,111

[22] Filed: Jul. 9, 1996

[30] Foreign Application Priority Data

Jul. 17, 1995 [FR] France .................................. 95 08595

[51] Int. Cl.$^6$ ........................... B65H 81/00; D05B 93/00
[52] U.S. Cl. .............................. 159/93; 156/93; 156/166; 156/433; 156/441
[58] Field of Search ................................ 156/166, 173, 156/175, 433, 441, 93, 264, 64

[56] References Cited

U.S. PATENT DOCUMENTS

| | | |
|---|---|---|
| 4,863,660 | 9/1989 | Cahuzac et al. . |
| 4,917,756 | 4/1990 | Cahuzac et al. . |
| 5,019,435 | 5/1991 | Cahuzac et al. . |
| 5,117,348 | 5/1992 | Romero et al. . |
| 5,239,457 | 8/1993 | Steidle et al. . |
| 5,543,005 | 8/1996 | Monget et al. ...................... 156/433 X |
| 5,637,175 | 6/1997 | Feygin et al. ............................ 156/264 |

FOREIGN PATENT DOCUMENTS

| | | |
|---|---|---|
| 0284497 | 3/1988 | European Pat. Off. . |
| 2110590 | 6/1983 | United Kingdom . |
| 2249050 | 4/1992 | United Kingdom . |

OTHER PUBLICATIONS

Klein, Allen, "Automated Tape Laying," Advanced Composites, Jan./Feb. 1989, pp. 44–52.

Leonard, LaVerne, "Automated Materials Deposition: A Putdown for Fabrication Costs, " Advanced Composites, Sep./Oct. 1987, pp. 51–58.

Cincinnati Milacron Sales Brochure Entitled "Into The Future . . . With Better Ways to Automate the Manufacture of Composite Parts," 1988, pp. 1–22.

*Primary Examiner*—Jeff H. Aftergut
*Attorney, Agent, or Firm*—Fisher, Christen & Sabol

[57] ABSTRACT

The present invention relates to a method and to a system for producing a reinforcement for a composite component, formed by said reinforcement embedded in a cured matrix, said reinforcement comprising superposed plies of thread. According to the invention, the system comprises means (5) for the memory storage and processing of data, in which means the mathematical model of the reinforcement (A) to be produced may be created and stored in memory and which are capable of controlling means (3) for steering the tool (1) for laying down and/or stitching thread (F).

2 Claims, 2 Drawing Sheets

METHOD AND SYSTEM FOR PRODUCING A REINFORCEMENT FOR A COMPOSITE COMPONENT

The present invention relates to a method and to a system for producing a reinforcement for a composite component. Said reinforcement comprises superposed plies of thread (especially carbon, glass or boron thread) and is subsequently embedded in a cured matrix in order to form said component.

More particularly, although not exclusively, such composite components are used in the aeronautical and space fields by virtue of their excellent properties of resistance to mechanical and/or thermal stresses.

Many methods are known for obtaining such composite components and, especially, their reinforcement. In general, the first step is to produce the reinforcement from fibers (threads), distributed in at least two directions, constituting superposed plies of thread, which can then be consolidated by stitching using a thread passing transversely through said plies. After this the material of the matrix is injected into the reinforcement and said material is cured in order to form said matrix and, thus, said composite component.

The plies of threads can be laid down in various ways. Thus, in one case, "pegs" (strands of rigid threads) around which plies of threads are arranged in two different directions are implanted permanently in a support, said pegs moreover consolidating said plies (patent FR-A-2 408 676).

In another case, illustrated especially by patent EP-B-0 284 497 of the assignee company, use is made of a thread laying-down head allowing each portion of thread to be pulled tight between points for positionally fixing its ends, these fixing points being formed by pins temporarily implanted in a support made of a material which can be penetrated by said pins, such as a foam of synthetic material. After forming the superposed plies of thread and after consolidating said plies by stitching using a through-thread, the pins are removed from the support.

Moreover, French patent application No. 94 04581 of the assignee company describes a method of the type described in the previous paragraph, in which the use of guide pins and of a specific laying-down head is avoided by laying down straight portions of thread by means of a needle, with respect to which the continuous thread, of which each of said portions forms a part, can slide, pulling tight the straight portion of thread above a support, and by fixing said straight portions of thread by stitching, without knotting, the ends of each of said portions into said support using said needle.

All of these methods, especially the last one described, make it possible to produce, without particular problems, other than those mentioned in French patent application No. 94 04581 dealing with the first two methods described, reinforcements and therefore components of simple shapes, for example flat panels, or shapes having a certain degree of curvature, of rectangular overall shape, or cylindrical components. However, for a specific application it is quite obvious that such "blanks" thereafter have to be cut and machined to obtain the desired "complex" shape. Such subsequent machining of course takes time and represents an oncost. It would therefore be desirable to have use of a method making it possible, in a simple fashion, to produce reinforcements of "complex" shapes "directly". This is the object of the present invention.

To this end, the method for producing a reinforcement for a composite component formed by said reinforcement embedded in a cured matrix, said reinforcement comprising superposed plies of thread, according to which method:

(a) at least some of said plies are produced by laying down straight portions of thread, forming part of a continuous thread, on a support, pulling tight each portion of thread between two points for positionally fixing the ends of said portion, the ply thus consisting of portions of thread extending at least substantially in parallel fashion with respect to each other, and the portions of thread of said ply extending in a direction which is either parallel or crossed with respect to the direction of the portions of threads of any other ply in the reinforcement; and (b) all the superposed plies are consolidated, especially by stitching, without knotting, a continuous thread passing through said plies, is noteworthy, according to the invention, in that prior to step (a), the mathematical model of the reinforcement to be produced is created and stored in memory and, for each ply to be produced of the reinforcement the contour of said ply together with its position relative to the previous ply already produced is defined with the aid of the data of the mathematical model of the reinforcement which are stored in memory and then the process of step (a) is initiated.

Thus, the method according to the invention makes it possible to produce, in a simple manner and on an industrial scale, reinforcements for complex composite components (that is to say ones which may be very thick, have variable thickness, and a changing profile), on the basis of their mathematical model, said components having a textile reinforcement including successive plies, oriented at will, and the shape of which depends, each time, on the mathematical model corresponding to the level (ply) in question. In other words, after having created the mathematical model for the component to be produced, it is "cut into slices", the thickness of a slice corresponding to that of a ply of thread.

Advantageously, for each ply of thread to be laid down, the intersection of the envelope surface of the reinforcement with a sectioning plane situated at the height corresponding to said ply is generated, thus obtaining a closed curve, then the points of intersection of this curve with an array, with spacing equal to the spacing of the threads to be laid down, of planes orthogonal to the plane defined by said closed curve and having a direction corresponding to that chosen as orientation for the threads of said ply are defined.

As a preference, in step (a):

said straight portions of thread are laid down by means of a needle, with respect to which the continuous thread, of which each of said portions forms a part, can slide, said needle being capable of moving relative to said support, pulling tight the straight portion of thread above the latter, to an extent equal to the length of said straight portion of thread; and said straight portions of thread are fixed by stitch ing, without knotting, at least one of the ends of each of said portions of thread into said support using said needle.

Moreover, the system for the implementation of the method which has just been described, of the type including a tool for laying down and/or stitching thread, linked to means for steering said tool, which means are intended to displace the latter in three mutually transverse directions X, Y, Z, is noteworthy, according to the invention, in that it comprises means for the memory storage and processing of data, in which the mathematical model of the reinforcement to be produced can be created and stored in memory, and which are capable of operating said means for steering said tool.

Said memory storage and processing means, in other words a computer or microcomputer, allow the abovementioned method to be implemented using a Computer Aided Design principle. Each ply of the reinforcement is converted into a file of X, Y, Z, points, including the orientation of the threads of the ply, said file serving to control the means for steering the tool for laying down and/or stitching thread, which will go and implant the thread at the points defined by this file.

Thus, on the basis of a CAD-created model of the reinforcement, the method and the system of the invention make it possible to determine each ply of thread in its contour and in its precise position relative to the immediately underlying ply (a bit like for a geographic map with its various contour lines). That then makes it possible to break down a reinforcement (component) by CAD in order to limit its contours to a slice, the successive cuts corresponding to one layer of thread laydown. This technique makes it possible to manufacture a component from woven composite material, starting from the mathematical model in order to obtain the physical model. Of course each ply, corresponding to a cutting level, may be produced with a specific weave. The orientations of the threads within the body of the component may be chosen to meet the required characteristics.

For preference, said tool for laying down and/or stitching thread is mounted on a rotary support at the lower end of which a needle is arranged.

Moreover, said steering means may comprise a stand provided with a subframe and with uprights each having a slideway for mounting a transverse bar on which is mounted a carriage, which can move in a first, X, direction, equipped with a first arm extending in a second, Y, direction orthogonal to the X direction and carrying a second arm able to slide transversely with respect to the plane defined by said bar and said first arm in a third, Z, direction, and motor means for driving said carriage and said first arm and second arm.

The figures of the appended drawing will make it easy to understand how the invention may be achieved.

Figure 1:
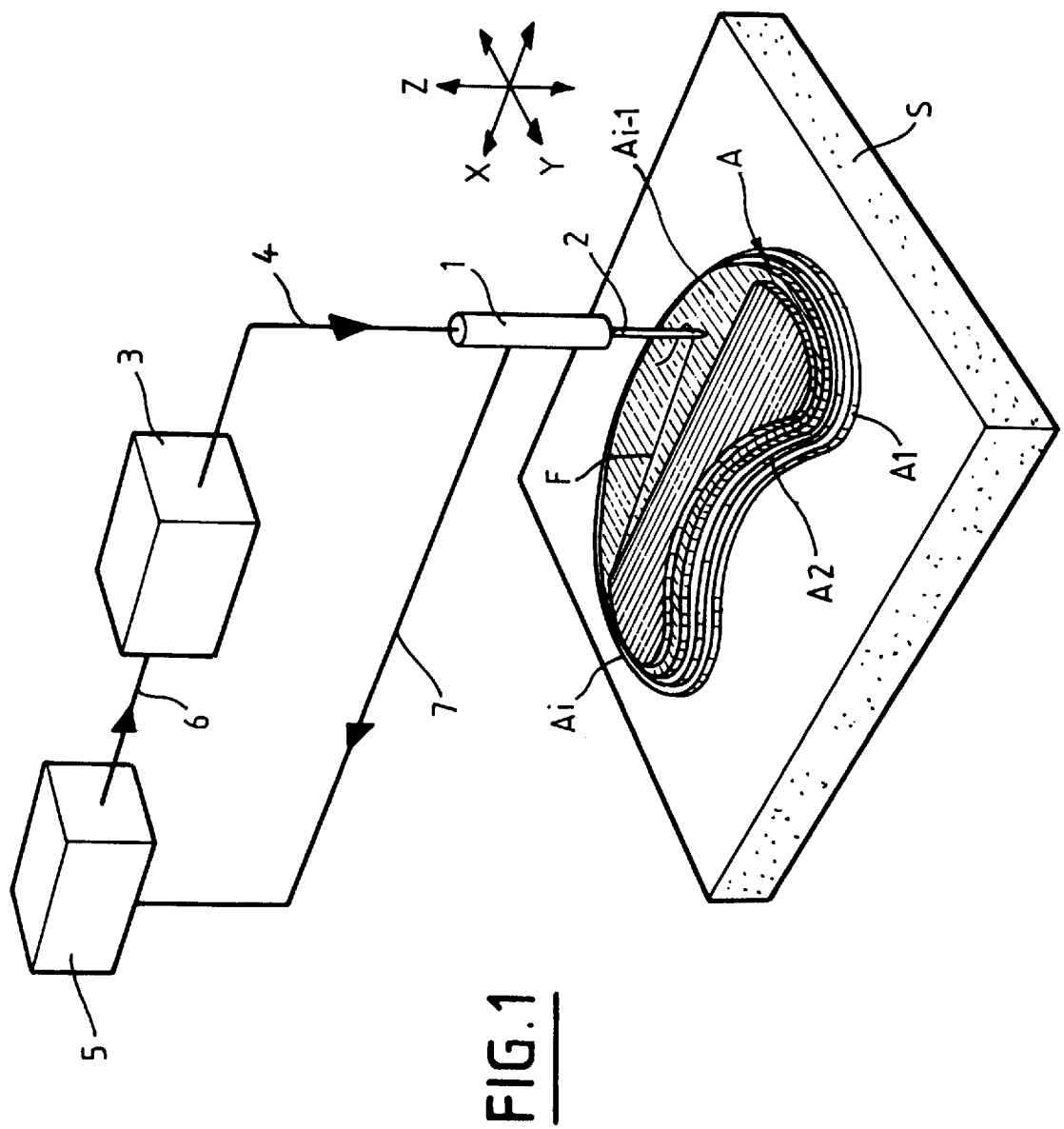
FIG. 1 illustrates, in perspective, very diagrammatically, the system according to the invention.

It can be seen, in FIG. 1, that the system according to the invention includes a tool 1 for laying down and/or stitching thread F fitted, in order to achieve this, in this example, with a needle 2, said tool 1 being connected to means 3 for steering the latter (link 4), these means being intended to move it in three mutually transverse directions X, Y, Z under the control (the modes for which are explained later) of means 5 for memory storage and processing of data (computer or microcomputer) connected to the steering means 3 and to the tool 1 by the respective links 6 and 7.

Moreover, FIG. 1 diagrammatically and, so to speak symbolically, represents a reinforcement A arranged on a support S in the process of being produced. It is clearly understood that the shape, represented in this figure, corresponds to no specific component but has been chosen at random for the sole purpose of illustrating the invention. What is more, the various layers or plies of thread A1, . . . , Ai forming it also merely represent a symbolic illustration making it easy to visualize them. In actual fact, such plies consisting of one (or possibly more) layer(s) of thread having a defined orientation would, because of the thickness of the threads used, be practically coincident. Furthermore, we have represented a ply (the uppermost one) in which the threads extend in the X direction and an immediately underlying ply in which the threads extend in the Y direction. It is quite obvious that other orientations are just as possible, relative to these two directions. Thus, if the X direction is at 0° and the Y direction at 90°, then the portions of thread can be laid down especially at 45° and 135°, or at any chosen angle.

As already indicated, for producing a reinforcement A for a composite component formed of said reinforcement embedded in a cured matrix, said reinforcement comprising superposed plies of thread:

(a) said plies A1, . . . , Ai are produced by laying down straight portions of thread forming part of a continuous thread F on a support S, pulling tight each portion of thread between two points for positionally fixing the ends of said portion, the ply thus consisting of portions of thread extending at least substantially in a parallel fashion with respect to each other, and the portions of thread of said ply extending in a direction which is either parallel or crossed with respect to the direction of the portions of thread of any other ply in the reinforcement (as illustrated in FIG. 1); and (b) all the superposed plies are consolidated, especially by stitching, without knotting, a continuous thread passing through said plies.

For laying down the thread, it is advantageous to use the method described in detail in French patent application No. 94 04581, in which, to sum up:

said straight portions of thread are laid down by means of a needle 2, with respect to which the continuous thread F of which each of said portions forms a part, can slide, said needle being capable of moving relative to said support S, pulling tight the straight portion of thread above the latter to an extent equal to the length of said straight portion of thread; and said straight portions of thread are fixed by stitching, without knotting, at least one of the ends of each of said portions of thread into said support S using said needle 2. In order to do this, the support S has of course to have, on the one hand, sufficient suppleness to allow stitching and, on the other hand, sufficient rigidity or compactness to avoid retraction of the thread.

More specifically, prior to step (a), the mathematical model of the reinforcement to be produced is created and stored in memory in the computer 5 and, for each ply Ai to be produced of the reinforcement A the contour of said ply Ai together with its position relative to the previous ply Ai–1 already produced is defined with the aid of the data of the mathematical model of the reinforcement A which are stored in memory and then the process of step (a) above is initiated, implemented by the tool for laying down and/or stitching thread 1, using the steering means 3 under the control of the computer 5.

The shape of the component (or of the reinforcement) may be defined by any suitable software. In cases where the finished component is, for example, warped or twisted, its planar shape can be taken into account in order to make the production of the reinforcement easier. The definitive shape will easily be obtained in the matrix injection mold.

In the software, for each level (layer or ply of thread to be laid down), the intersection of the envelope surface of the reinforcement with a cutting plane situated at the corresponding height is generated. In this way a closed curve is obtained, and then the points of intersection of this curve with an array, with a spacing equal to the spacing of the threads to be laid down, of planes orthogonal to the plane defined by said closed curve and having a direction corresponding to the one chosen for the orientation of the threads of the corresponding ply are defined. The coordinates of these points of intersection are output in the form of a file by cutting level. All of the files, corresponding to all of the cutting levels, are used as data for the laying down of the threads, controlled by the means 3 for steering the tool 1.

As described in detail in French patent application No. 94 04581 (in the case, of course, of a method using stitching in accordance with the one described in this document being used), a standard laying-down cycle comprises, for each end of a straight portion of thread, the following movements of the thread laying-down tool 1:

movement towards the targeted point, vertical descent, descent for stitching in the support, parallel with the needle 2, retreat by the same amount, reascent with rotation through 180° in order correctly to reposition the exit of the thread F relative to the subsequent displacement, and displacement toward the other end of the portion of thread.

Figure 2:
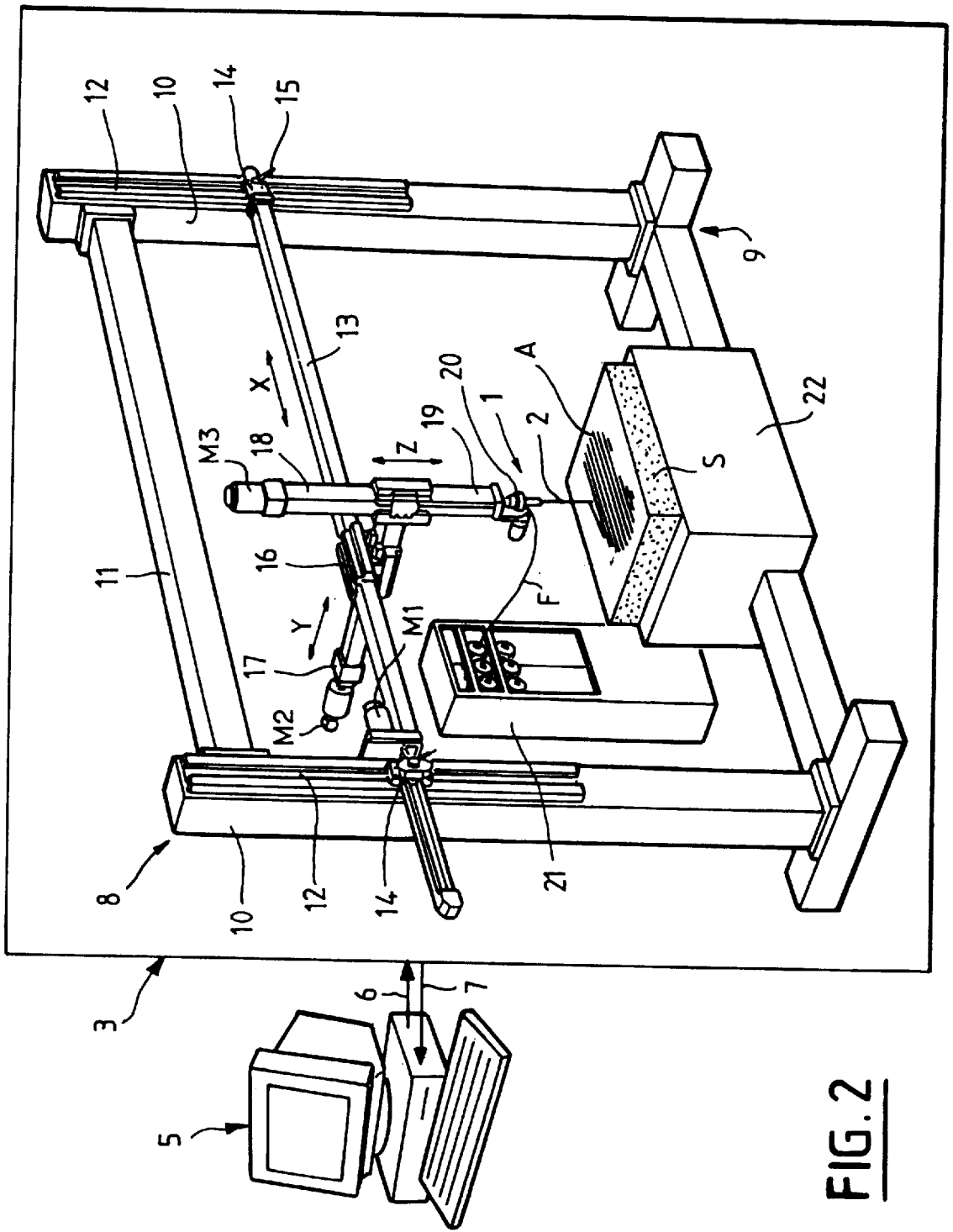
FIG. 2 shows, in perspective, one embodiment of the system according to the invention.

More precisely, FIG. 2 shows a concrete embodiment (of course nonlimiting) of a system according to the invention. The data memory storage and processing means, consisting of a computer or microcomputer 5, are connected to the means 3 for steering the tool for laying down and/or stitching thread 1 (link 6), said steering means 3 including a stand 8 provided with a subframe 9 and with vertical uprights 10, connected at their upper part by a horizontal transverse member 11. Moreover, each vertical upright 10 includes a slideway 12, and a transverse bar 13 is fixed, close to its ends, in slides 14 mounted in slideways 12 in which they can be immobilized by screws 15. By virtue of this arrangement, the bar 13 can be adjusted in terms of height on the uprights 10.

Mounted on the bar 13 is a carriage 16 on which is provided a horizontal arm 17 sliding transversely and adjustably relative to the bar 13. At one of its ends, the horizontal arm 17 carries a vertical arm 18 which can also slide adjustably. At its lower end 19, the vertical arm 18 has fixing means, especially a rotary support 20, which are designed to take the tool for laying down and/or stitching 1 the thread F coming from a stock of reels of thread 21. In addition, a base 22 is provided to take the support S for the reinforcement A.

It is understood that by virtue of the arrangement of the bar 13 and of the arms 17 and 18, the end 19 can be set in any desired position relative to the support S in three transverse directions X, Y, Z, especially ones which are orthogonal, by means of motors M1, M2 and M3 which are represented, by way of example, mounted on the bar 13 and at the ends of the arms 17 and 18 and drive these in these three directions using appropriate known means with rack and pinion, worm, or the like.

The reinforcements, or blanks, obtained are then placed in a mold into which a resin is injected and polymerized in order to obtain the composite component. The polymerization of the resin may be brought about by an increase in temperature, a beam of electrons, or any other appropriate phenomenon. It would also be possible to use a liquid metal with which to impregnate the reinforcement so as to obtain a composite with metal matrix. It is also possible to produce a reinforcement using threads coated with thermoplastic powder or including thermoplastic threads. In this case, heating followed by compression of this reinforcement in a mold provide a component with a thermoplastic matrix.

It is also possible to envisage the layers being laid down on a web of woven or nonwoven fabric. The strip passes through a series of stations where it receives a ply each time. Finally, it is brought under the impregnation press where it is impregnated with the matrix and achieves its definitive shape. Thanks to that procedure it is possible to mass-produce components.

Furthermore, it will be noted that in order to produce a component whose shape is such that it has a special profile on both faces, it is advantageous and convenient to start with a central fabric of constant thickness, then to lay down the plies on one face of the fabric and next to turn it over in order to lay down the plies on the other face. In this case, the central support fabric remains trapped between the two series of plies laid down.

I claim:

1. A method for producing a complex, irregular shaped, contoured, three dimensional reinforcement for a composite component formed by said reinforcement embedded in a cured matrix, said reinforcement comprising superimposed plane, irregular shaped plies of thread, each plane ply consisting of straight portions of thread extending at least substantially in parallel fashion with respect to each other, and the straight portions of thread of each plane ply extending in a direction which is either parallel or crossed with respect to the direction of the straight portions of thread of any other plane ply in the reinforcement, said method comprising the following steps:

(a) creating and storing in a memory a mathematical model of the reinforcement to be produced;

(b) using said mathematical model in order to obtain a physical model of each plane ply by:

(i) generating an intersection of an envelope surface on the reinforcement with a sectioning plane situated at a height corresponding to said plane ply, thus obtaining a closed curve representing an outer edge of a slice having a thickness corresponding to that of a plane ply of said thread, so that said closed curve represents the contour of said plane ply together with its position relative to a previous plane ply already produced;

(ii) then generating points of intersection of said closed curve with an array of planes orthogonal to the plane defined by said closed curve and having a direction corresponding to that chosen as orientation for the straight portions of threads of said ply, said planes having spacing equal to the spacing of said portions of thread;

(c) laying down on a support said straight portions of thread of each plane ply by means of a needle, with respect to which a continuous thread can slide, each of said straight portions being a part of said continuous thread and said needle being capable of moving relative to said plane support, the ends of said straight portions of thread of said plane ply being fixed to said support using said needle by stitching without knotting in such a way that said ends correspond to said points of intersection, and said portions of thread are pulled tight to an extent equal to the length of said portions of thread, said complex, contoured three dimensional reinforcement for a composite component being built up plane ply by plane ply by said method, said laying operation of a continuous thread being continuous and being conducted without cutting the thread, and the method of producing said reinforcement not involving any boring step.

2. The method as claimed in claim 1, wherein, in step (a):

said straight portions of thread are laid down by means of a needle, with respect to which the continuous thread, of which each of said portions forms a part, can slide, said needle being capable of moving relative to said support, pulling tight the straight portion of thread above the support, to an extent equal to the length of said straight portion of thread; and said straight portions of thread are fixed by stitching, without knotting, at least one of the ends of each of said portions of thread into said support using said needle.

* * * * *